US010064300B2

(12) United States Patent
I et al.

(10) Patent No.: US 10,064,300 B2
(45) Date of Patent: Aug. 28, 2018

(54) ELECTRICAL JUNCTION BOX

(71) Applicant: Yazaki Corporation, Tokyo (JP)

(72) Inventors: Sunsoku I, Makinohara (JP); Takaaki Kakimi, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/194,850

(22) Filed: Mar. 3, 2014

(65) Prior Publication Data

US 2014/0246217 A1 Sep. 4, 2014

(30) Foreign Application Priority Data

Mar. 4, 2013 (JP) .................................. 2013-042028

(51) Int. Cl.
*H05K 5/06* (2006.01)
*H05K 7/02* (2006.01)

(52) U.S. Cl.
CPC ............... *H05K 5/06* (2013.01); *H05K 7/026* (2013.01)

(58) Field of Classification Search
CPC .......... H02G 3/08; H02G 3/081; H02G 3/088; H02G 3/16; H05K 5/00; H05K 5/02; H05K 5/04; H05K 5/063; H05K 5/06; B06R 16/00; B06R 16/0239; B06R 16/02; H01H 9/02; H01H 9/04
USPC .......... 174/50, 50.5, 535, 520, 59, 559, 560, 174/50.51, 50.52, 561, 563, 564; 439/76.2, 76.1, 949, 535; 361/600, 601, 361/679.01, 730, 752; 220/3.2, 308, 4.01, 220/4.02, 3.8
See application file for complete search history.

(56) References Cited

U.S. PATENT DOCUMENTS

| 5,828,544 A | 10/1998 | Matsuda |
| 5,967,819 A * | 10/1999 | Okada ........................... 439/212 |
| 7,544,887 B2 * | 6/2009 | Iizuka .................... H02G 3/081 |
| | | 174/135 |
| 7,642,452 B2 * | 1/2010 | Kanazawa et al. ............. 174/50 |

(Continued)

FOREIGN PATENT DOCUMENTS

| DE | 19720434 A1 | 12/1997 |
| JP | 01-135783 U1 | 9/1989 |

(Continued)

OTHER PUBLICATIONS

Japanese Office Action drafted by Examiner, of the Japanese Patent Office, dated Nov. 30, 2016, in corresponding Japanese Patent Application No. 2013-042028.

(Continued)

*Primary Examiner* — Dimary Lopez Cruz
(74) *Attorney, Agent, or Firm* — Locke Lord LLP

(57) ABSTRACT

Disclosed is an electrical junction box including a case, and a block housed in the case. The case includes a frame, and a lower cover attached to a lower end side of the frame a joint part part of an outer wall of the frame and an outer wall of the cover an upper end of the outer wall of the lower cover is positioned more inwardly than a lower end of the outer wall of the frame and nearly the same height as a component insertion plane. At an edge portion of the block is disposed a waterproof barrier located between the component housing of the block and the joint part part and extending below the component insertion plane of a lower end of the component housing.

3 Claims, 5 Drawing Sheets

(56) References Cited

U.S. PATENT DOCUMENTS

| | | | | |
|---|---|---|---|---|
| 7,893,364 B2* | 2/2011 | Oda | ...................... | H05K 7/026 |
| | | | | 174/50 |
| 7,934,934 B2* | 5/2011 | Taniguchi | .............. | H02G 3/083 |
| | | | | 439/76.1 |
| 2006/0021779 A1* | 2/2006 | Kanazawa | ............. | H02G 3/088 |
| | | | | 174/67 |
| 2010/0108374 A1* | 5/2010 | Korcz et al. | ................... | 174/520 |
| 2010/0307814 A1* | 12/2010 | Aoki et al. | .................... | 174/520 |
| 2013/0032371 A1 | 2/2013 | Makino | | |

FOREIGN PATENT DOCUMENTS

| | | |
|---|---|---|
| JP | 2011-125174 A | 6/2011 |
| JP | 2013034320 A | 2/2013 |

OTHER PUBLICATIONS

Japanese Office Action drafted by Examiner, of the Japanese Patent Office, dated Feb. 3, 2017, in corresponding Japanese Patent Application No. 2013-042028.

Office Action dated Jun. 6, 2018 issued for corresponding German Patent Application No. 10 2014 203 797.2.

* cited by examiner

ELECTRICAL JUNCTION BOX

CROSS REFERENCE TO RELATED APPLICATION

This application is on the basis of Japanese Patent Application NO. 2013-042028, the contents of which are hereby incorporated by reference.

TECHNICAL FIELD

This invention is related to electrical junction boxes mounted to automobiles.

BACKGROUND ART

Electrical junction boxes which are mounted to automobiles have various configurations, for example, as shown in FIG. 6 (see the PTL 1). An electrical junction box 301 shown in FIG. 6 is provided with a case 2, a block 303 housed in the case 2, a plurality of components such as a relay, a fuse, a hub bar, and a cable with terminal 6.

The foregoing case 2 includes a frame 4, and a lower cover 5 attached to a lower side of the frame 4. A part shown in FIG. 6 is a joint part par of an outer wall 41 of the frame 4 and an outer wall 51 of the lower cover 5. Furthermore, in the joint part illustrated in the figure an upper end 51a of the outer wall 51 of the lower cover 5 is positioned inwardly further than the a lower end 41a of the outer wall 41 of the frame 4.

The foregoing block 303 includes a plurality of component housings to be attached to the components. Furthermore, as shown in FIG. 6, the component housing 31 positioned adjacent to the joint part of the outer wall 41 of the frame 4, and the outer wall 51 of the lower cover 5 houses at its lower side a cable with terminal 6 or bus bar. This cable with terminal 6 has its terminal housed in the component housing 31 and its cable guided to outside the component housing 31.

Furthermore, a boundary A of the frame 4 and the cover 5 in the inside of the case 2 (that is, an upper end 51a of the outer wall 51 of the lower cover 5 in the joint part) is positioned at the nearly same height as the component insertion plane 31a of the lower side of the component housing 31. By "the component insertion plane 31a of the lower side of the component housing 31" is meant a surface where a cavity housing the cable with terminal 6 or the bus bar opens.

CITATION LIST

Patent Literature

[PTL 1]
Japanese Patent Application Laid-Open Publication No. 2011-125174

SUMMARY OF INVENTION

Technical Problem

Disadvantageously, the foregoing conventional electrical junction box 301 poses the following drawbacks. Namely, the joint part of the outer wall 41 of the frame 4 and the outer wall 51 of the lower cover 5 configures labyrinth such that the outer walls 41 and 51 are overlaid with each other, but when powerful water such as high pressure washing water is poured to the case 2, the water enters into the case 2 from the joint part, and explodes toward the block 303 from the boundary A1 of the frame 4 and the cover 5 in the inside of the case, so as to splash adjacent to the terminal of the cable with terminal 6. Note that when the boundary A1 of the frame 4 and the cover 5 in the inside of the case 2 is positioned at the same height as the component insertion plane 31a or above the component insertion plane 31a, the water entering from the joint part is liable to specifically splash adjacent to the terminal of the cable with terminal 6.

Solution to Problem

Accordingly, an object of the invention is to provide an electrical junction box preventing water entering into a case from joint part of a frame and a cover from splashing to a component attached to component housing of a block.

The invention according to one aspect in order to achieve the object relates to an electrical junction box including: a case including a frame, and cover attached to a lower side of the frame; a block housed in the case; a joint part of an outer wall of the frame and an outer wall of the cove; and a waterproof barrier located between a component housing and the joint part at an outer edge of the block, and extending below a component insertion plane of a lower edge of the component housing.

Preferably, a boundary between the frame and the cover in a inner surface of the case is located at the same height as the component insertion plane or above.

Advantageous Effects of Invention

According to the invention of the one aspect, provision of the waterproof barrier to the block prevents the water entering from the joint part of the frame and the cover from splashing to the component attached to the component housing of the block.

According to the invention, when the boundary of the frame and the cover in the inside of the case is positioned at the same height or above as the component insertion plane, the water entering from the joint part of the frame and the cover into inside the case is liable to splash to the component attached to the component housing, but provision of the waterproof barrier disposed to the block prevents the water entering from the joint part of the frame and the cover from splashing to the component attached to the component housing of the block.

DESCRIPTION OF EMBODIMENTS

Figure 1:
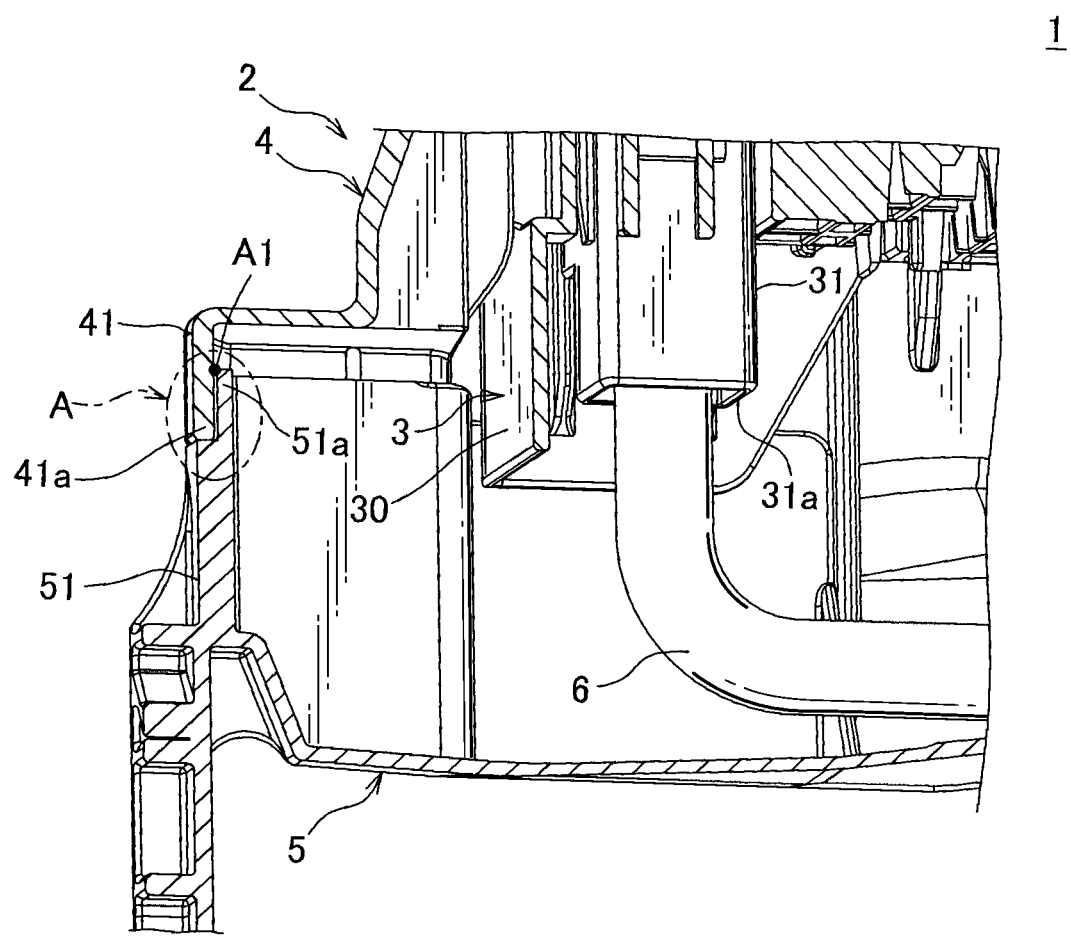
FIG. 1 is a perspective view illustrating an electrical junction box related to one embodiment of the invention.
Figure 2:
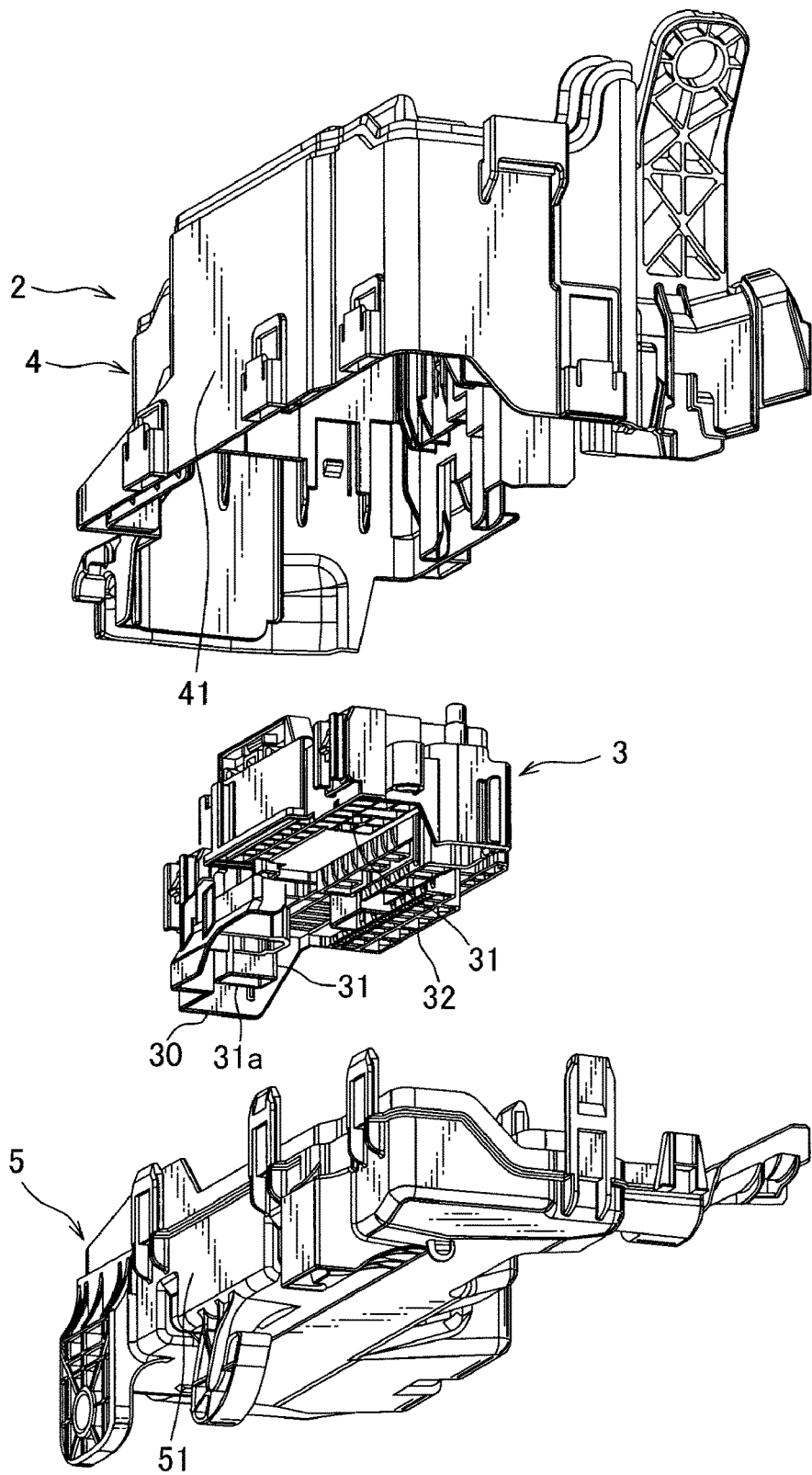
FIG. 2 is an exploded view of the electrical function box illustrated in FIG. 1.
Figure 3:
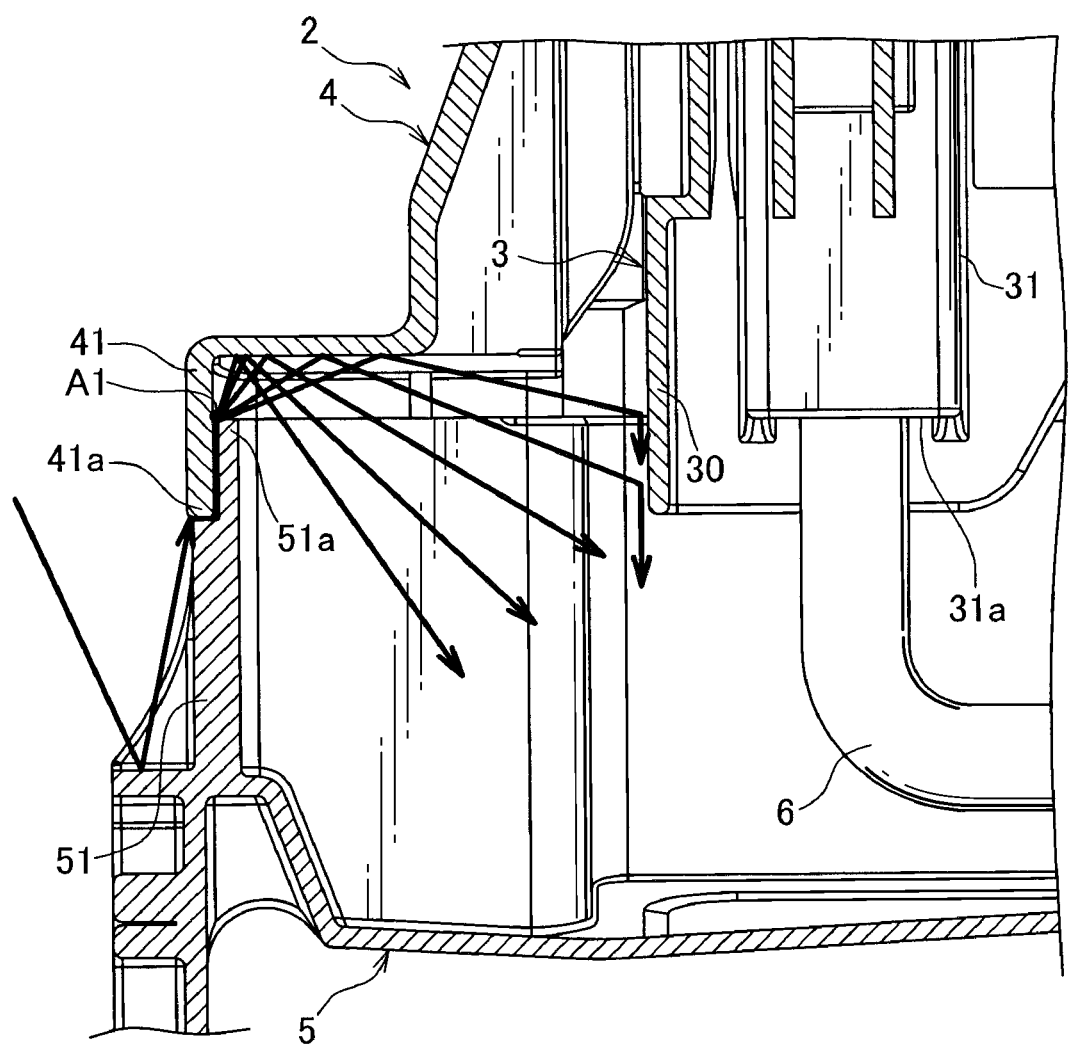
FIG. 3 is an explanatory view illustrating entering passage of water in the electrical junction box shown in FIG. 1.

With reference to FIGS. 1 to 3 "an electrical junction box" related to one embodiment of the invention is discussed.

An electrical junction box 1 shown in FIG. 1 is what is mounted to an automobile, and includes a case 2, a block 3 to be housed in the case 2, and a plurality of components such as a relay, a fuse, a bus bar, and a cable with terminal 6.

The case 2 includes a frame 4 formed into a frame-like shape, a lower cover 5 to be attached to a lower side of the frame 4 (referred to as "a cover" in the claims), and an upper cover (not shown) to be attached to the frame 4 as shown in FIG. 2. These frame 4, lower cover 5, and upper cover are made of synthetic resin. The block 3 is assembled into inside the frame 4.

A part A in FIG. 1 is a joint part of an outer wall 41 of the frame 4 and an outer wall 51 of the lower cover 5. In the joint part in the present embodiment an upper end 51a of the outer wall 51 of the lower cover 5 is positioned more inwardly than a lower end 41a of the outer wall 41 of the frame 4. The joint part part makes labyrinth by the outer walls 41 and 51 overlapping to each other.

The foregoing block 3 is block-like shaped of synthetic resin as shown in FIG. 2. This block 3 includes a plurality of component housing 31, 32, to which components such as the relay, the fuse, the bus bar, and the cable with terminal 6 are attached. The component housing 31 arranged adjacent to the joint part part of the outer wall 41 of the frame 4 and the outer wall 51 of the lower cover 5 houses in a lower end portion the cable with terminal 6o or the bus bar as shown in FIGS. 1 and 3. This cable with terminal 6 has terminal thereof housed in the component housing 31 and the cable thereof guided to outside the component housing 31.

In the present embodiment the boundary A1 of the frame 4 and the cover 5 in the inside of the case is positioned nearly at the same height as the component insertion plane 31a of lower end side of the component housing 31. By the term "the component insertion plane 31a of lower end side of the component housing 31" is meant a surface in which a cavity opens that houses the cable with terminal 6 or the bus bar. The joint part of the frame 4 and the lower cover 5 in the present embodiment has the upper end 51a of the outer wall 51 of the lower cover 5 positioned more inwardly than the lower end 41a of the outer wall 41 of the frame 4 as described above. Therefore, in the present embodiment, the upper end 51a of the outer wall 51 of the lower cover 5 becomes "the boundary A1 of the frame 4 and the cover 5 in the inside of the case 2."

Figure 4:
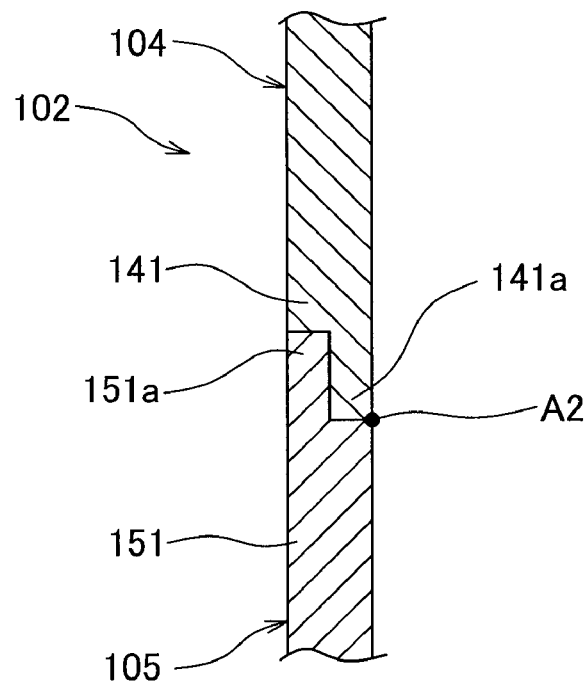
FIG. 4 is a cross-sectional view illustrating a modification of a case shown in FIG. 1.
Figure 5:
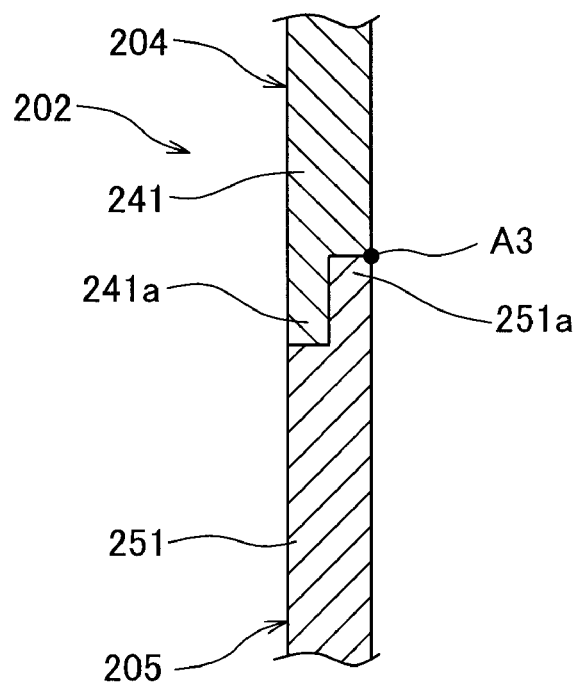
FIG. 5 is a cross-sectional view illustrating other modification of a case shown in FIG. 1.
Figure 6:
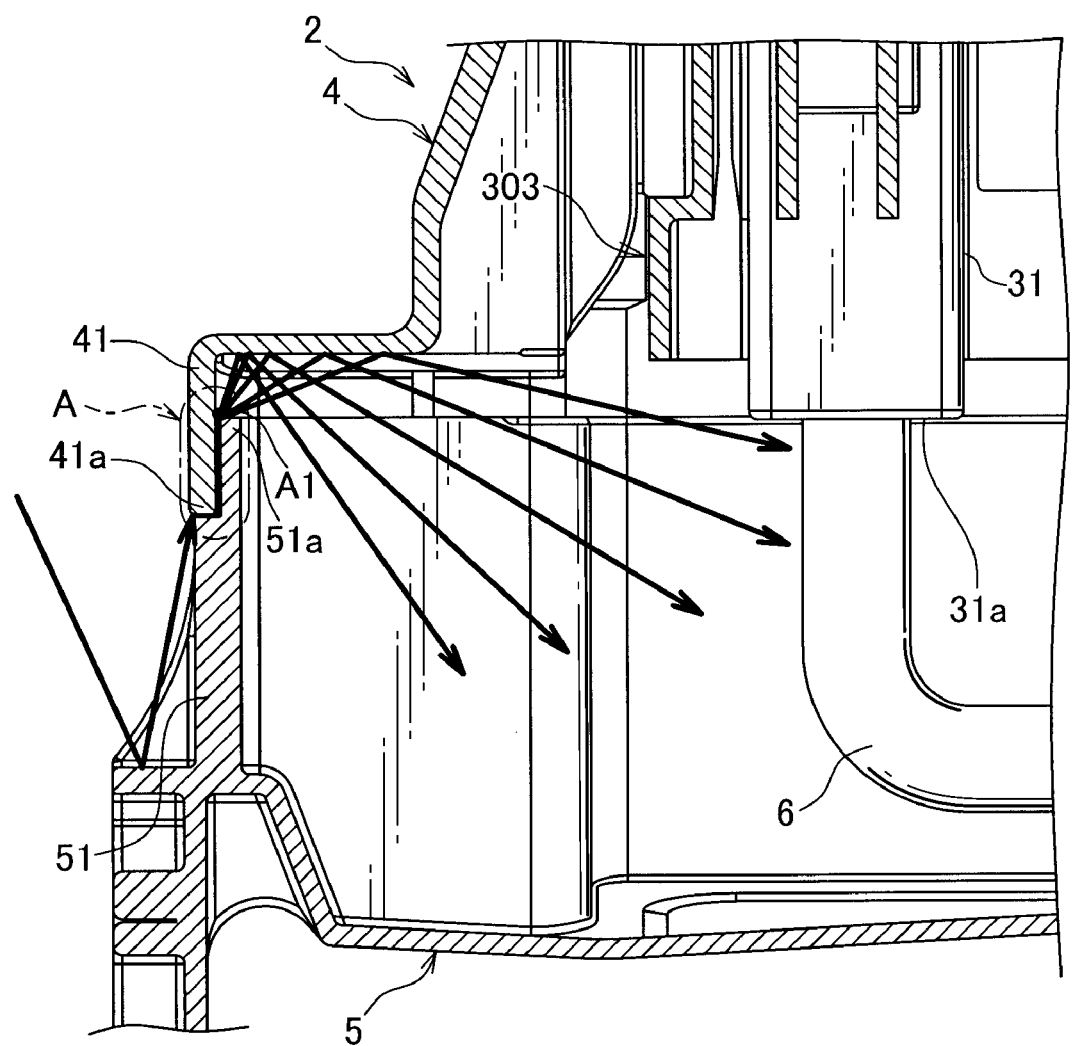
FIG. 6 is an explanatory view illustrating entering passage of water in a conventional electrical junction box.

Furthermore, FIGS. 4 and 5 are cross-sectional views illustrating other case included in the present invention. As the case 102 shown in FIG. 4, in a joint part of the frame 104 and the lower cover 105, when a lower end 141a of an outer wall 141 of a frame 104 is positioned more inwardly than an upper end 151a of an outer wall. 151 of a lower cover 105, the lower end 141a of the outer wall. 141 of the frame 104 becomes "a boundary A2 of the frame 104 and the cover 105 in the inside of the case 102." A case 202 shown in FIG. 5 has, in a joint part of the frame 204 and the lower cover 205, an upper end 251a of an outer wall 251 of a lower cover 205 is positioned more inwardly than a lower end 241a of an outer wall 241 of a frame 204. Therefore, the upper end 251a of the outer wall 251 of the lower cover 205 becomes "a boundary A3 of the frame 204 and the cover 205 in the inside of the case 202."

Note that in the present invention "the boundaries (A1, A2, and A3) of the frame and the cover in the inside of the case" may be located above the component insertion plane 31a of the lower end side of the component housing 31.

Furthermore, in the present invention at an outer edge of the block 3 is disposed, the waterproof barrier 30 located between the component housing 31 of the block 3 and the joint part part and extending below the component insertion plane 31a of the lower side of the component.

In the foregoing electrical junction box the joint part of the outer wall 41 of the frame 4 and the outer wall 51 of the lower cover 5 is made labyrinth as mentioned above, thus making unlikely water entering, but when powerful water such as high presser washing water is poured to the case 2, the water enters into the case 2 from the joint part and the water explodes toward the block 3 from the boundary A1 of the frame 4 and the cover 5 in the inside of the case 2, in the electrical junction box 1 provision of the waterproof barrier 30 to the block 3 prevents the water entering from the joint part part of the frame 4 and the lower cover 5 and exploding from the boundary A1 from splashing adjacent to the terminal of the cable with terminal 6 or bus bar attached to the component housing 31. Therefore, it can be prevented that the terminal of the cable with terminal 6 or the bus bar is watered.

Note that the aforementioned embodiments only show typical configurations of the invention, the invention should not be limited to these configurations. Namely, unless otherwise such changes and modifications depart from the scope of the present invention hereafter defined, they should be construed as being included therein.

REFERENCE SIGNS LIST 1 electrical junction box
2 case
3 block
4 frame
5 lower cover
30 waterproof barrier
31 component housing
31a component insertion plane
41 outer wall
51 outer wall

The invention claimed is:

1. An electrical junction box comprising:
   a case including a frame, and a cover attached to a lower end side of the frame;
   a separate block, housed in the case, the block including a plurality of component housings for components;
   a joint part of an outer wall of the frame and an outer wall of the cover where the outer wall of the frame and the outer wall of the cover contact in an attached state; and
   a waterproof barrier disposed at an outer edge of the block and between a component housing and the joint part, extending below a component insertion plane of a lower end of the component housing with the waterproof barrier in contact with neither the frame nor the cover, and having an exposed surface below the component insertion plane in facing relation with the joint part,
   wherein a vertical tip of the outer wall of the frame is formed into an L-shape or an inverse L-shape, and a vertical tip of the outer wall of the cover is formed into a shape complementary to the shape of the vertical tip of the outer wall of the frame, the joint part is formed such that the vertical tips of the outer wall of the frame and the outer wall of the cover are vertically jointed in halving joint form with each other.

2. The electrical junction box as claimed in claim 1, wherein the frame and the cover meet in the attached state, is located at the same height or above as the component insertion plane.

3. An electrical junction box comprising:
  a case including a frame, and a cover attached to a lower end side of the frame;
  a separate block, housed in the case, the block including a plurality of component housings for components;
  a joint part of an outer wall of the frame and an outer wall of the cover where the outer wall of the frame and the outer wall of the cover contact in an attached state; and
  a waterproof barrier disposed at an outer edge of the block and between a component housing and the joint part, extending below a component insertion plane of a lower end of the component housing with the waterproof barrier in contact with neither the frame nor the cover, and having an exposed surface below the component insertion plane and exposed to an outside of the block,
  wherein a vertical tip of the outer wall of the frame is formed into an L-shape or an inverse L-shape, and a vertical tip of the outer wall of the cover is formed into a shape complementary to the shape of the vertical tip of the outer wall of the frame, the joint part is formed such that the vertical tips of the outer wall of the frame and the outer wall of the cover are vertically jointed in halving joint form with each other.

\* \* \* \* \*